(12) United States Patent
Lee et al.

(10) Patent No.: US 12,414,449 B2
(45) Date of Patent: Sep. 9, 2025

(54) DISPLAY DEVICE COMPRISING A CONTACT HOLE THAT CONTACTS MULTIPLE LAYERS

(71) Applicant: LG DISPLAY CO., LTD., Seoul (KR)

(72) Inventors: SeonWoo Lee, Uiwang-si (KR); Hana Jung, Seoul (KR); Geondo Park, Paju-si (KR)

(73) Assignee: LG Display Co., Ltd. (KR)

( * ) Notice: Subject to any disclaimer, the term of this patent is extended or adjusted under 35 U.S.C. 154(b) by 427 days.

(21) Appl. No.: 17/897,469

(22) Filed: Aug. 29, 2022

(65) Prior Publication Data

US 2023/0217739 A1    Jul. 6, 2023

(30) Foreign Application Priority Data

Dec. 30, 2021 (KR) .................... 10-2021-0192151

(51) Int. Cl.
| | |
|---|---|
| *H01L 29/08* | (2006.01) |
| *H10K 59/121* | (2023.01) |
| *H10K 59/126* | (2023.01) |
| *H10K 59/131* | (2023.01) |
| *H10D 30/67* | (2025.01) |
| *H10D 86/40* | (2025.01) |
| *H10D 86/60* | (2025.01) |

(52) U.S. Cl.
CPC ....... *H10K 59/131* (2023.02); *H10K 59/1213* (2023.02); *H10K 59/1216* (2023.02); *H10K 59/126* (2023.02); *H10D 30/6723* (2025.01); *H10D 30/6755* (2025.01); *H10D 86/423* (2025.01); *H10D 86/481* (2025.01); *H10D 86/60* (2025.01)

(58) Field of Classification Search
CPC ............. H10K 59/131; H10K 59/1213; H10K 59/126; H10K 59/1216; H01L 27/1225; H01L 27/78633; H01L 27/7869
USPC .......................................................... 257/40
See application file for complete search history.

(56) References Cited

FOREIGN PATENT DOCUMENTS

| | | | | |
|---|---|---|---|---|
| CN | 109742091 A | * | 5/2019 | ....... G02F 1/136286 |
| CN | 113013193 A | * | 6/2021 | ......... H01L 27/1214 |
| KR | 10-2167131 | | 10/2020 | |
| KR | 20210086054 A | * | 7/2021 | ........... H10K 59/131 |

OTHER PUBLICATIONS

Cite the machine translation Yongsun J (KR-20210086054-A).*
Cite the translation Shen G (CN-113013193-A1).*
Cite the machine translation Wang M (CN-109742091-A).*

* cited by examiner

*Primary Examiner* — Phuc T Dang
(74) *Attorney, Agent, or Firm* — Fish & Richardson P.C.

(57) ABSTRACT

A display device includes a substrate, a first conductive layer on the substrate, a buffer layer on the first conductive layer, a first semiconductor layer on the buffer layer, a gate insulating layer on the first semiconductor layer and the buffer layer and a second conductive layer on the gate insulating layer, wherein the second conductive layer is in contact with the first conductive layer and the first semiconductor layer through a first contact hole on the buffer layer and the gate insulating layer.

13 Claims, 7 Drawing Sheets

DISPLAY DEVICE COMPRISING A CONTACT HOLE THAT CONTACTS MULTIPLE LAYERS

CROSS-REFERENCE TO RELATED APPLICATION

This application claims the priority of Korean Patent Application No. 10-2021-0192151 filed on Dec. 30, 2021, which is hereby incorporated by reference in its entirety.

BACKGROUND

Field of the Disclosure

The present disclosure relates to a display device, and more particularly, to a display device which can increase luminance.

Description of the Background

As display devices which are used for a monitor of a computer, a television, or a cellular phone, there are an organic light emitting display device (OLED) which is a self-emitting device and a liquid crystal display device (LCD) which requires a separate light source.

A substrate on which the organic light emitting display among them is manufactured is configured by minute patterns such as transistors, storage capacitors, and wiring lines and the organic light emitting display device is driven by a complex connection between the transistors, the storage capacitors, and the wiring lines.

Recently, in accordance with the increased demands for an organic light emitting display device with a high luminance and a high resolution, demands for an efficient space layout and a connection structure between components included in the organic light emitting display device are increasing.

SUMMARY

The present disclosure is to provide a display device in which a number of contact holes is reduced to utilize the space more efficiently.

The present disclosure is also to provide a display device which increases an area of an emission area to have a high luminous characteristic without reducing an area of the storage capacitor.

Further the present disclosure is to provide a display device having a high luminance and a high resolution by increasing a size of a storage capacitor without reducing an area of an emission area.

The present disclosure is not limited to the above-mentioned and other features, which are not mentioned above, can be clearly understood by those skilled in the art from the following descriptions.

In one aspect of the present disclosure, a display device includes a substrate, a first conductive layer on the substrate, a buffer layer on the first conductive layer, a first semiconductor layer on the buffer layer, a gate insulating layer on the first semiconductor layer and the buffer layer and a second conductive layer on the gate insulating layer, wherein the second conductive layer is in contact with the first conductive layer and the first semiconductor layer through a first contact hole on the buffer layer and the gate insulating layer.

According to the present disclosure, a number of contact holes through which a plurality of layers is contact is reduced to reduce a space occupied by the contact holes.

According to the present disclosure, the area of the emission area is increased using a space ensured by reducing the contact holes to ensure a high luminance.

According to the present disclosure, the area of the storage capacitor is increased using the space ensured by reducing the contact holes so that the display device having a high luminance and a high resolution without causing a residual image may be provided.

The effects according to the present disclosure are not limited to the contents exemplified above, and more various effects are included in the present specification.

Other detailed matters of the exemplary aspects are included in the detailed description and the drawings.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

Throughout the specification, when an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

Figure 1:
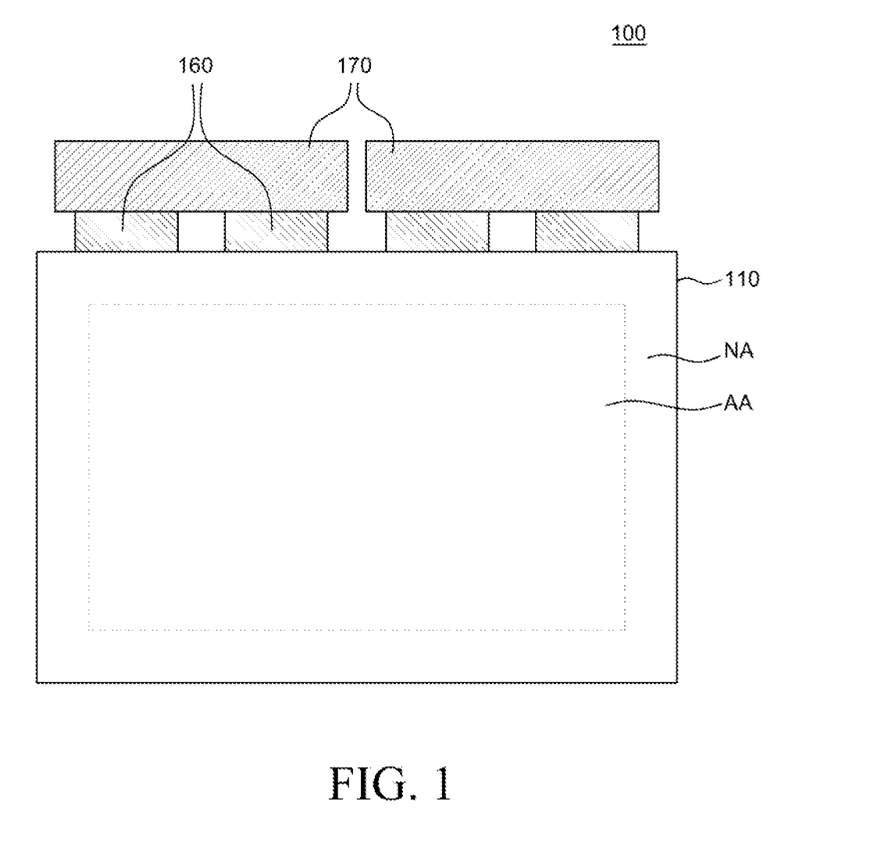
FIG. 1 illustrates a plan view of a display device according to an aspect of the present disclosure.
Figure 2:
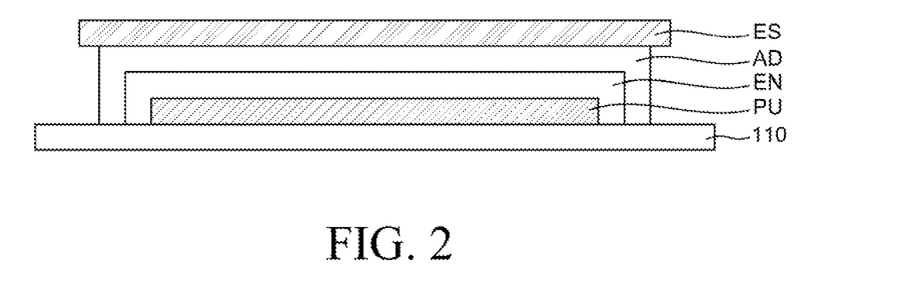
FIG. 2 illustrates a schematic cross-sectional view of a display device according to an aspect of the present disclosure.

FIG. 1 illustrates a plan view of a display device according to an exemplary aspect of the present disclosure. FIG. 2 illustrates a schematic cross-sectional view of a display device according to an exemplary aspect of the present disclosure. For the convenience of description, in FIG. 1, among various components of the display device 100, only a substrate 110, a plurality of flexible films 160, and a plurality of printed circuit boards 170 are illustrated.

The substrate 110 is a base member which supports various components of the display device 100 and may be configured by an insulating material. For example, the substrate 110 may be formed of plastic such as polyimide (PI) or glass, but is not limited thereto.

The substrate 110 includes an active area AA and a non-active area NA.

The active area AA is an area where images are displayed. In the active area AA, a pixel unit PU configured by a plurality of sub pixels may be disposed to display images. For example, the pixel unit PU is configured by a plurality of sub pixels including a light emitting diode and a driving circuit to display images.

The non-active area NA is an area where no image is displayed and various wiring lines and driving ICs for driving the sub pixels disposed in the active area AA are disposed. For example, in the non-active area NA, various driving ICs such as a gate driver IC and a data driver IC may be disposed.

The plurality of flexible films 160 is disposed at one end of the substrate 110. The plurality of flexible films 160 is electrically connected to one end of the substrate 110. The plurality of flexible films 160 is films in which various components are disposed on a base film having malleability to supply a signal to the plurality of sub pixels of the active area AA. One ends of the plurality of flexible films 160 are disposed in the non-active area NA of the substrate 110 to supply a data voltage to the plurality of sub pixels of the active area AA. In the meantime, even though four flexible films 160 are illustrated in FIG. 1, the number of flexible films 160 may vary depending on the design, but is not limited thereto.

In the meantime, a driving IC such as a gate driver IC or a data driver IC may be disposed on the plurality of flexible films 160. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 160 by a chip on film technique, but is not limited thereto.

The printed circuit board 170 is connected to the plurality of flexible films 160. The printed circuit board 170 is a component which supplies signals to the driving IC. Various components may be disposed in the printed circuit board 170 to supply various driving signals such as a driving signal or a data voltage to the driving IC. In the meantime, even though two printed circuit boards 170 are illustrated in FIG. 1, the number of printed circuit boards 170 may vary depending on the design and is not limited thereto.

Referring to FIG. 2, the pixel unit PU is disposed on an insulating layer IU. The pixel unit PU may be disposed so as to correspond to the active area AA. The pixel unit PU is a component which includes a plurality of sub pixels to display images. The plurality of sub pixels of the pixel unit PU is minimum units which configure the active area AA and a light emitting diode and a driving circuit may be disposed in each of the plurality of sub pixels. For example, the light emitting diode of each of the plurality of sub pixels may include an organic light emitting diode including an anode, an organic emission layer, and a cathode or an LED including an N-type and a P-type semiconductor layers and an emission layer. The driving circuit for driving the plurality of sub pixels may include a driving element such as a thin film transistor or a storage capacitor, but is not limited thereto. Hereinafter, for the convenience of description, it is assumed that the light emitting diode of each of the plurality of sub pixels is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the substrate 110 on which the light emitting diode is disposed. In the case of the top emission type, a reflective layer may be formed below the anode to allow the light emitted from the light emitting diode to travel to the upper portion of the substrate 110, that is, toward the cathode.

According to the bottom emission type, light emitted from the light emitting diode is emitted to a lower portion of the substrate 110 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the substrate 110.

Hereinafter, for the convenience of description, the description will be made by assuming that the display device 100 according to an exemplary aspect of the present disclosure is a bottom emission type display device, but it is not limited thereto.

The encapsulating layer EN is disposed to cover the pixel unit PU. The encapsulation layer EN seals the light emitting diode of the pixel unit PU. The encapsulation layer EN may protect the light emitting diode of the pixel unit PU from moisture, oxygen, and impacts of the outside. The encapsulation layer EN may be formed by a single inorganic layer or formed alternately laminating a plurality of inorganic layers and a plurality of organic layers. For example, the inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto. However, the encapsulation layer EN may be omitted depending on the design.

The encapsulation substrate ES is disposed on the encapsulation layer EN. The encapsulating substrate ES protects the organic light emitting diode of the pixel unit PU together with the encapsulating layer EN. The encapsulation substrate ES may protect the light emitting diode of the pixel unit PU from moisture, oxygen, and impacts of the outside. For example, the encapsulation substrate ES may be formed of a material having a high modulus of approximately 200 to 900 MPa. The encapsulation substrate ES may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulation substrate ES is formed of a metal material, the encapsulation substrate ES may be implemented as an ultra-thin film and provide a strong resistance against external impacts and scratches.

An adhesive layer AD may be disposed between the encapsulation layer EN and the encapsulation substrate ES. The adhesive layer AD may bond the encapsulation layer EN and the encapsulation substrate ES to each other. The adhesive layer AD is formed of a material having an adhesiveness and may be a thermosetting or natural curable type adhesive. For example, the adhesive layer AD may be formed of an optical clear adhesive (OCA) or a pressure sensitive adhesive (PSA), but is not limited thereto.

In the meantime, the adhesive layer AD may be disposed to enclose the encapsulation layer EN and the pixel unit ES. That is, the pixel unit PU may be sealed by the encapsulation layer EN. The adhesive layer AD may protect the light emitting diode of the pixel unit PU from moisture, oxygen, and impacts of the outside together with the encapsulation layer EN and the encapsulation substrate ES. In this case, the adhesive layer AD may further include a moisture absorbent. The moisture absorbent may be particles having hygroscopicity and absorb moisture and oxygen from the outside to minimize permeation of the moisture and oxygen into the pixel unit PU.

Even though not illustrated in the drawing, a polarizer may be disposed on a rear surface of the substrate 110. The polarizer selectively transmits light to reduce the reflection of external light which is incident onto the substrate 110. Specifically, the pixel unit PU includes various metal materials applied to the semiconductor element, the wiring line, and the organic light emitting diode. Therefore, the external light incident onto the substrate 110 may be reflected from the metal material so that the visibility of the display device 100 may be reduced due to the reflection of the external light. Therefore, when the polarizer is disposed, the polarizer suppresses the reflection of the external light to increase the outdoor visibility of the display device 100. However, the polarizer may be omitted depending on an implementation example of the display device 100.

Hereinafter, the plurality of sub pixels of the pixel unit PU will be described in more detail with reference to FIGS. 3 to 7.

Figure 3:
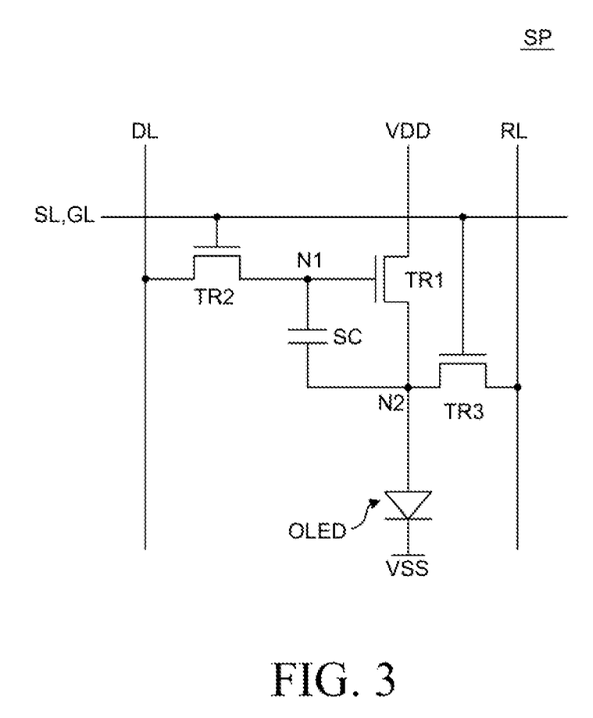
FIG. 3 illustrates a circuit diagram of a sub pixel of a display device according to an aspect of the present disclosure.

FIG. 3 illustrates a circuit diagram of a sub pixel of a display device according to an exemplary aspect of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL is disposed on the substrate 110.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current flows from the source electrode to the drain electrode. Since in the N-type thin film transistor, electrons flow from the source electrode to the drain electrode, the current flows from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 is turned on and when the voltage of the first node N1 is lower than the threshold voltage, the first transistor TR1 is turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are implemented as one wiring line, the gate line GL and the sensing line SL may be implemented as separate wiring lines, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of a plurality of capacitor electrodes is connected to the first node N1 and the other one is connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the exemplary aspect of the present disclosure has a 3T1C structure including three transistors TR1, TR2, and TR3 and one storage capacitor SC. However, the number and a connection relationship of the transistors and the storage capacitor may vary in various ways depending on the design and are not limited thereto.

Figure 4:
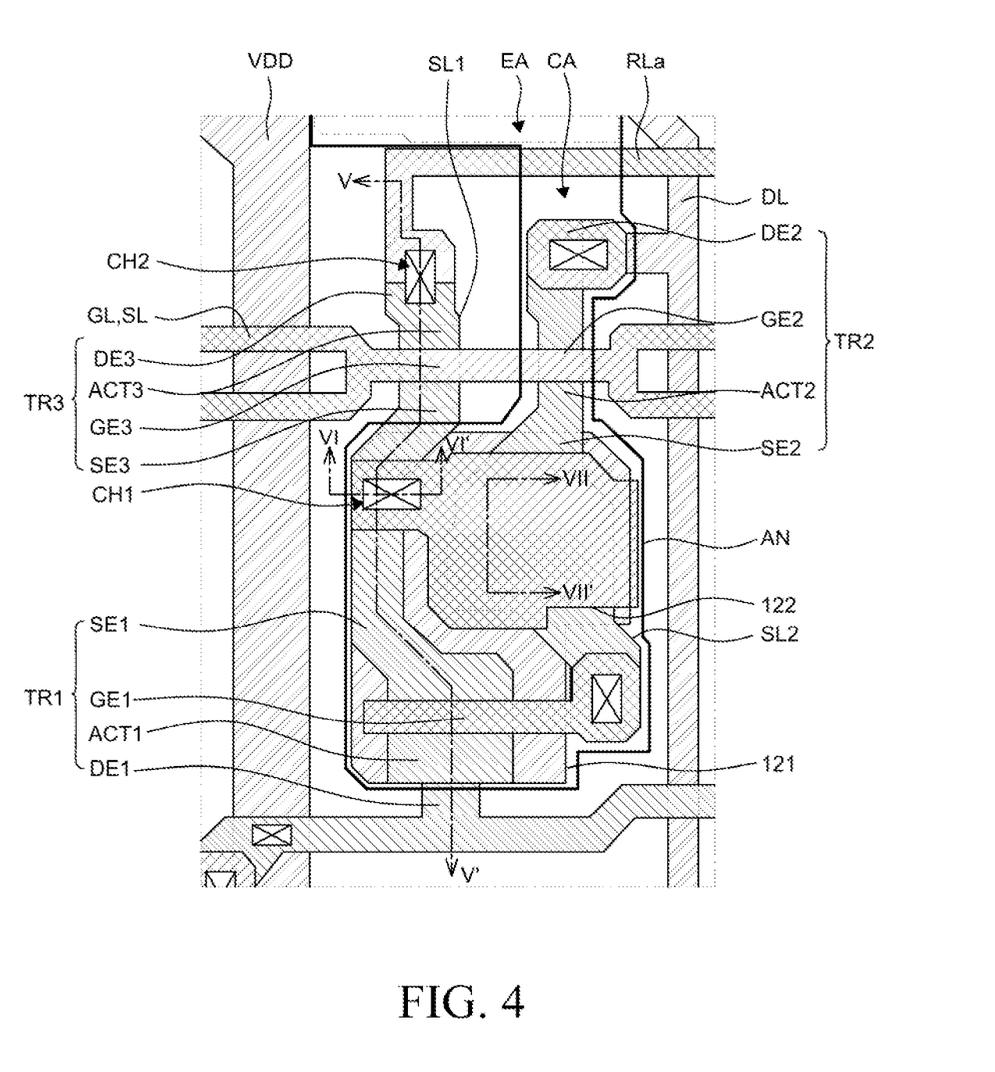
FIG. 4 illustrates an enlarged plan view of a sub pixel of a display device according to an aspect of the present disclosure.
Figure 5:
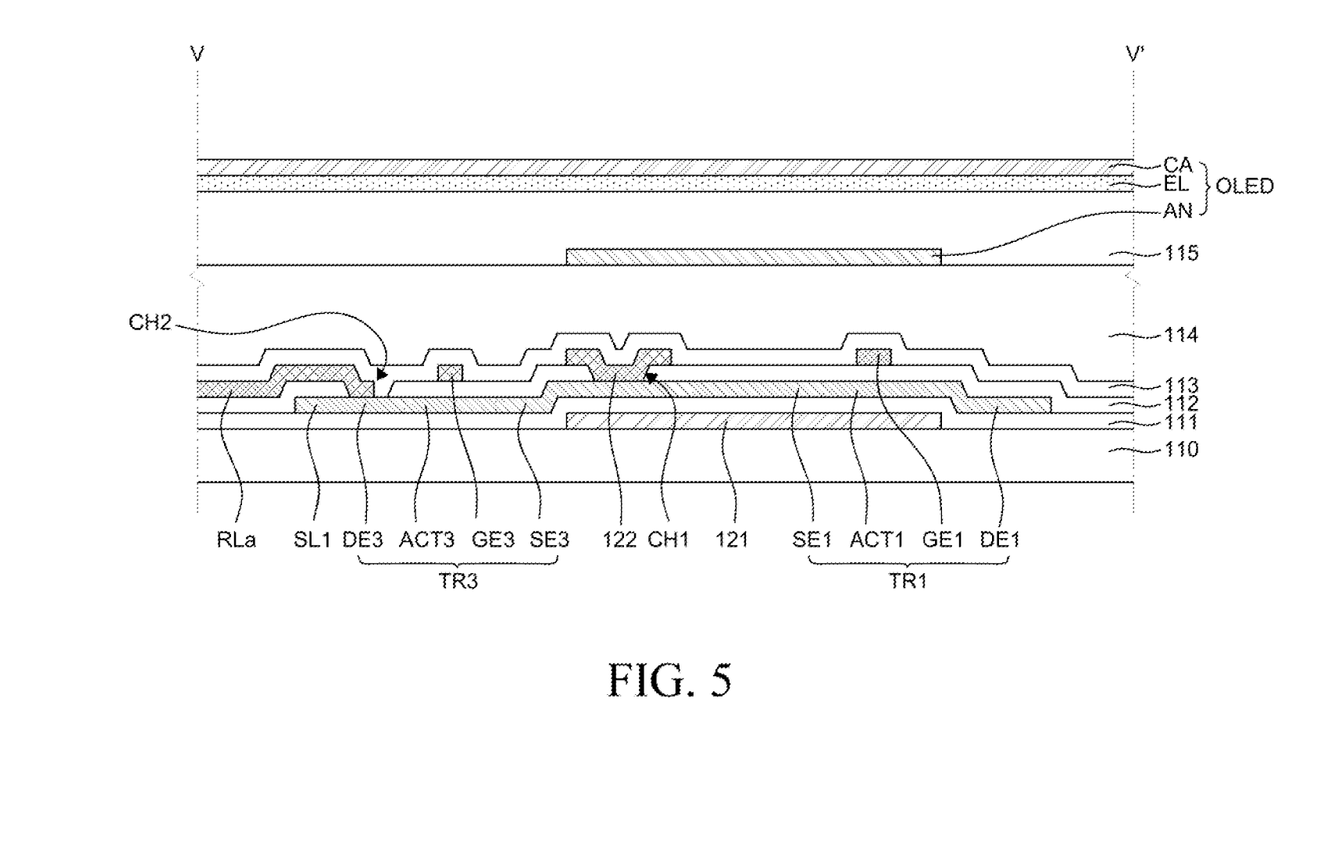
FIG. 5 illustrates a cross-sectional view taken along line V-V of FIG. 4.
Figure 6:
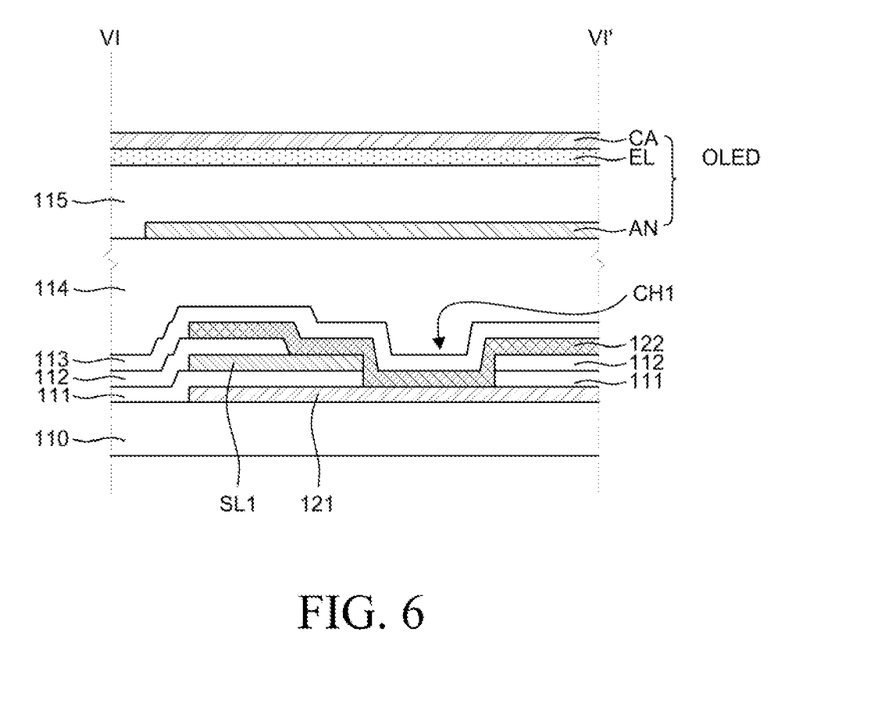
FIG. 6 illustrates a cross-sectional view taken along line VI-VI' of FIG. 4.
Figure 7:
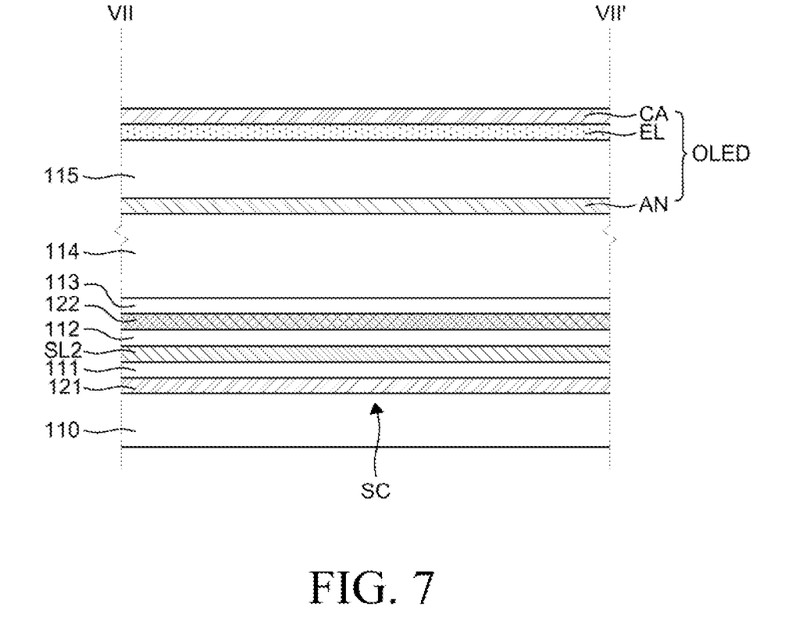
FIG. 7 illustrates a cross-sectional view taken along line VII-VII' of FIG. 4.

FIG. 4 illustrates an enlarged plan view of a sub pixel of a display device according to an exemplary aspect of the present disclosure. FIG. 5 illustrates a cross-sectional view taken along the line V-V of FIG. 4. FIG. 6 illustrates a cross-sectional view taken along the line VI-VI' of FIG. 4. FIG. 7 illustrates a cross-sectional view taken along the line VII-VII' of FIG. 4. FIG. 4 illustrates only a partial area of one sub pixel among a plurality of sub pixels of a display device. In FIG. 4, for the convenience of description, the bank 115 is omitted and a boundary of the anode AN is illustrated with a bold solid line. Referring to FIGS. 4 to 7, the display device 100 according to the exemplary aspect of the present disclosure includes a substrate 110, a buffer layer 111, a gate insulating layer 112, a passivation layer 113, a planarization layer 114, a bank 115, a first semiconductor layer SL1, a second semiconductor layer SL2, a first conductive layer 121, a second conductive layer 122, a first transistor TR1, a second transistor TR2, a third transistor TR3, a storage capacitor SC, a light emitting diode OLED, a gate line GL, a sensing line SL, a data line DL, a reference line RL, and a high potential power line VDD.

The plurality of sub pixels SP may emit different color light. For example, the plurality of sub pixels SP may include a red sub pixel, a green sub pixel, a blue sub pixel, and a white sub pixel. For example, the red sub pixel, the white sub pixel, the blue sub pixel, and the green sub pixel may be sequentially disposed along a row direction. However, the disposing order of the plurality of sub pixels SP is not limited thereto.

Referring to FIG. 4, each of the plurality of sub pixels SP includes an emission area EA and a circuit area CA. The emission area EA is an area which independently emits one color light and the circuit area CA is an area in which a first transistor TR1, a second transistor TR2, a third transistor TR3, and a storage capacitor SC are disposed. In the emission area EA, the bank 115 is not disposed and in the circuit area CA, the bank 115 may be disposed.

Referring to FIGS. 4 to 7, a plurality of high potential power lines VDD, a plurality of data lines DL, a plurality of reference lines RL, and a first conductive layer 121 are disposed on the substrate 110.

The plurality of high potential power lines VDD, the plurality of data lines DL, the plurality of reference lines, and the first conductive layer 121 are disposed on the same layer of the substrate 110 and formed of the same conductive material. For example, the plurality of high potential power lines VDD, the plurality of data lines DL, the plurality of reference lines RL, and the first conductive layer 121 may be configured by a conductive material such as copper (Cu), aluminum (Al), molybdenum (Mo), nickel (Ni), titanium (Ti), and chrome (Cr), or an alloy thereof, but are not limited thereto.

The plurality of high potential power lines VDD is wiring lines which transmit the high potential power signal to each of the plurality of sub pixels SP. The plurality of high potential power lines VDD extends between the plurality of sub pixels SP in a column direction and two sub pixels SP which are adjacent to each other in the row direction may share one high potential power line VDD among the plurality of high potential power lines VDD. The plurality of high potential power lines VDD supplies a high potential power voltage to the first transistor TR1 of each of the plurality of sub pixels SP.

The plurality of data lines DL extends between the plurality of sub pixels SP in the column direction to transmit a data voltage to each of the plurality of sub pixels SP. Each of the plurality of data lines DL transmits a data voltage to the second transistor TR2 of each sub pixel SP.

The plurality of reference lines RL extends between the plurality of sub pixels SP in the column direction to transmit a reference voltage to each of the plurality of sub pixels SP. The plurality of sub pixels SP which forms one pixel may share one reference line RL. Therefore, one reference line RL transmits a reference voltage to the third transistor TR2 of each of the plurality of sub pixels SP.

The first conductive layer 121 is disposed so as to overlap the first active layer ACT1 of at least the first transistor TR1 among the plurality of transistors TR1, TR2, and TR3 to block light incident onto the first active layer ACT1. If light is irradiated onto the first active layer 122, a leakage current is generated so that the reliability of the first transistor TR1 which is a driving transistor may be degraded. At this time, when the first conductive layer 121 configured by an opaque conductive material is disposed so as to overlap the first active layer ACT1, light incident from a lower portion of the substrate 110 onto the first active layer ACT1 is blocked so that the reliability of the first transistor TR1 may be improved. However, it is not limited thereto and the first conductive layer 121 may be disposed so as to overlap the second active layer ACT2 of the second transistor TR2 and the third active layer ACT3 of the third transistor TR3. Further, the first conductive layer 121 may function as one capacitor electrode of the storage capacitor SC. The storage capacitor SC will be described in more detail below.

The buffer layer 111 is disposed on the plurality of high potential power lines VDD, the plurality of data lines DL, the plurality of reference lines RL, and the first conductor layer 121. The buffer layer 111 may reduce permeation of moisture or impurities through the substrate 110. For example, the buffer layer 111 may be configured by a single layer or a double layer of silicon oxide SiOx or silicon nitride SiNx, but is not limited thereto. Further, the buffer layer 111 may be omitted depending on a type of substrate 110 or a type of transistor, but is not limited thereto.

A first semiconductor layer SL1 and a second semiconductor layer SL2 which are spaced apart from each other are disposed on the buffer layer 111 in each of the plurality of sub pixels SP. The first semiconductor layer SL1 and the second semiconductor layer SL2 may be formed of an oxide semiconductor. For example, the first semiconductor layer SL1 and the second semiconductor layer SL2 may be formed of an oxide semiconductor such as indium gallium zinc oxide (IGZO), indium gallium Oxide (IGO), and indium tin zinc oxide (ITZO).

The first semiconductor layer SL1 and the second semiconductor layer SL2 may include a semiconductor area and a conductive area. A part of the first semiconductor layer SL1 and the second semiconductor layer SL2 configures the first active layer ACT1 of the first transistor TR1, the second active layer ACT2 of the second transistor TR2, and the third active layer ACT3 of the third transistor TR3 and the corresponding area may be a semiconductor area. The other part of the first semiconductor layer SL1 and the second semiconductor layer SL2 may function as an electrode or a wiring line so that it may be a conductive area. An area in which the oxide semiconductors of the first semiconductor layer SL1 and the second semiconductor layer SL2 become conductive may serve as an electrode or a wiring line. The conductive area may be formed by performing plasma treatment on the oxide semiconductor, but is not limited thereto. Even though it is not illustrated in the drawing, in the conductive area of the first semiconductor layer SL1 and the second semiconductor layer SL2, a conductive pattern may be disposed. The conductive pattern may be disposed on an upper surface or a lower surface of the first semiconductor layer SL1 and the second semiconductor layer SL2. The conductive pattern is disposed on the first semiconductor layer SL1 and the second semiconductor layer SL2 to facilitate electrical connection with the other component. The conductive pattern may include any one of metals such as aluminum (Al), gold (Au), silver (Ag), copper (Cu), tungsten (W), molybdenum (Mo), chrome (Cr), tantalum (Ta), and titanium (Ti) or an alloy thereof. For example, the conductive pattern may be an alloy of molybdenum (Mo) and titanium (Ti), but is not limited thereto.

In each of the plurality of sub pixels SP, the first transistor TR1, the second transistor TR2, the third transistor TR3, and the storage capacitor SC are disposed on the buffer layer 111.

First, the first transistor TR1 includes a first active layer ACT1, a first gate electrode GE1, a first source electrode SE1, and a first drain electrode DE1.

The first active layer ACT1 is disposed on the buffer layer 111. The first active layer ACT1 may include a semiconductor area and a conductive area of the first semiconductor layer SL1. That is, a channel area which is an area of the first semiconductor layer SL1 overlapping the first gate electrode GE1 is formed of an oxide semiconductor which does not become conductive. The source area and the drain area which do not overlap the first gate electrode GE1 may be an area in which the oxide semiconductor becomes conductive, but is not limited thereto.

A part of the first semiconductor layer SL1 to which the first active layer ACT1 extends may serve as the first source electrode SE1 and the first drain electrode DE1. That is, the part of the first semiconductor layer SL1 located between the high potential power line VDD and the first active layer ACT1 serves as the first drain electrode DE1. The part of the first semiconductor layer SL1 located between the first active layer ACT1 and the third source electrode SE3 of the third transistor TR3 may serve as the first source electrode SE1. At this time, the first source electrode SE1 and the first drain electrode DE1 may be a conductive area of the first semiconductor layer SL1. That is, the first source electrode SE1 and the first drain electrode DE1 may be an area in which the oxide semiconductor becomes conductive.

The gate insulating layer 112 is disposed on the first active layer ACT1, the first source electrode SE1, and the first drain electrode DE1. The gate insulating layer 112 is a layer for electrically insulating the first gate electrode GE1 from the first active layer ACT1 and may be formed of an insulating material. For example, the gate insulating layer 112 may be configured by a single layer or a double layer of silicon oxide SiOx or silicon nitride SiNx, but is not limited thereto.

The first gate electrode GE1 is disposed on the gate insulating layer 112 so as to overlap the first active layer ACT1. The first gate electrode GE1 may be configured by a conductive material such as copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. At this time, an auxiliary high potential power line may be further disposed to electrically connect the first drain electrode DE1 with the high potential power line VDD. One end of the auxiliary high potential power line is electrically connected to the high potential power line VDD and the other end is electrically connected to the first drain electrode DE1 of each of the plurality of sub pixels SP.

The second transistor TR2 includes a second active layer ACT2, a second gate electrode GE2, a second source electrode SE2, and a second drain electrode DE2.

The second active layer ACT2 is disposed on the buffer layer 111. The second active layer ACT2 may include a semiconductor area and a conductive area of the second semiconductor layer SL2. That is, a channel area which is an area of the second semiconductor layer SL2 overlapping the second gate electrode GE2 is formed of an oxide semiconductor which does not become conductive. The source area and the drain area which do not overlap the second gate electrode GE2 may be an area in which the oxide semiconductor becomes conductive, but is not limited thereto.

A part of the second semiconductor layer SL2 to which the second active layer ACT2 extends may serve as the second source electrode SE2 and the second drain electrode DE2. That is, the part of the second semiconductor layer SL2 located between the data line DL and the second active layer ACT2 serves as the second drain electrode DE2. The part of the second semiconductor layer SL2 located between the second active layer ACT2 and the gate electrode of the first transistor TR1 serves as the second source electrode SE2. At this time, the second source electrode SE2 and the second drain electrode DE2 may be a conductive area of the second semiconductor layer SL2. That is, the second source electrode SE2 and the second drain electrode DE2 may be an area in which the oxide semiconductor becomes conductive.

The second source electrode SE2 is electrically connected to the first gate electrode GE1 of the first transistor TR1. The first gate electrode GE1 may be electrically connected to the second source electrode SE2 through a contact hole formed in the gate insulating layer 112. Accordingly, the first transistor TR1 may be turned on or turned off by a signal from the second transistor TR2.

The gate insulating layer 112 is disposed on the second active layer ACT2, the second source electrode SE2, and the second drain electrode DE2 and the second gate electrode GE2 is disposed on the gate insulating layer 112.

The second gate electrode GE2 is disposed on the gate insulating layer 112 so as to overlap the second active layer ACT2. The second gate electrode GE2 may be integrally formed with the gate line GL and the sensing line SL serving as one wiring line and the second transistor TR2 may be turned on or turned off based on the gate voltage transmitted to the second gate electrode GE2. The second gate electrode GE2 may be configured by a conductive material such as copper (Cu), aluminum (Al), molybdenum (Mo), nickel (Ni), titanium (Ti), chrome (Cr), or an alloy thereof, but is not limited thereto.

The gate line GL and the sensing line SL are wiring lines which transmit the gate voltage to each of the plurality of sub pixels SP and cross the circuit area of the plurality of sub pixels SP to extend in the row direction. For example, the gate line GL and the sensing line SL extend in the row direction to intersect the plurality of high potential power lines VDD, the plurality of data lines DL, and the reference line RL extending in the column direction.

The third transistor TR3 includes a third active layer ACT3, a third gate electrode GE3, a third source electrode SE3, and a third drain electrode DE3.

The third active layer ACT3 is disposed on the buffer layer 111. The third active layer ACT3 may include a semiconductor area and a conductive area of the first semiconductor layer SL1. That is, a channel area which is an area of the first semiconductor layer SL1 overlapping the third gate electrode GE3 is formed of an oxide semiconductor which does not become conductive. The source area and the drain area which do not overlap the third gate electrode GE3 may be an area in which the oxide semiconductor becomes conductive, but is not limited thereto.

A part of the first semiconductor layer SL1 to which the third active layer ACT3 extends may serve as the third source electrode SE3 and the third drain electrode DE3. That is, the part of the first semiconductor layer SL1 located between the auxiliary reference line RLa extending from the reference line RL and the third active layer ACT3 serves as the third drain electrode DE3. The part of the first semiconductor layer SL1 located between the third active layer ACT3 and the first source electrode SE1 of the first transistor TR1 may serve as the third source electrode SE3. At this time, the third source electrode SE3 and the third drain electrode DE3 may be a conductive area of the first semiconductor layer SL1. That is, the third source electrode SE3 and the third drain electrode DE3 may be an area in which the oxide semiconductor becomes conductive.

Therefore, the first active layer ACT1 of the first transistor TR1 and the third active layer ACT3 of the third transistor TR3 may be connected to each other. Specifically, the first semiconductor layer SL1 may configure the first active layer ACT1 and the third active layer ACT3 so that the first active layer ACT1 and the third active layer ACT3 may be configured as a single layer. Therefore, the first active layer ACT1 and the third active layer ACT3 are areas of the first semiconductor layer SL1 which does not become conductive. Therefore, the first active layer ACT1 and the third active layer ACT3 may be connected by the conductive area of the first semiconductor layer SL1 disposed between the first active layer ACT1 and the third active layer ACT3.

The gate insulating layer 112 is disposed on the third active layer ACT3, the third source electrode SE3, and the third drain electrode DE3 and the third gate electrode GE3 is disposed on the gate insulating layer 112.

The third gate electrode GE3 is disposed on the gate insulating layer 112 so as to overlap the third active layer ACT3. The third gate electrode GE3 may be integrally formed with the gate line GL and the sensing line SL and the third transistor TR3 may be turned on or turned off based on the sensing voltage transmitted to the third transistor TR3. The third gate electrode GE3 may be configured by a conductive material such as copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The second conductive layer 122 is disposed on the gate insulating layer 112. The second conductive layer 122 is disposed on the same layer as the first gate electrode GE1, the second gate electrode GE2, and the third gate electrode GE3 to be formed of the same conductive material. The second conductive layer 122 may be configured by a conductive material such as copper (Cu), aluminum (Al), molybdenum (Mo), nickel (Ni), titanium (Ti), chrome (Cr), or an alloy thereof, but it is not limited thereto.

Referring to FIGS. 4 to 7, the storage capacitor SC is disposed in the circuit area CA of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC includes a first capacitor electrode, a second capacitor electrode, and a third capacitor electrode.

First, in each of the plurality of sub pixels SP, the first capacitor electrode is disposed between the substrate 110 and the buffer layer 111. The first capacitor electrode may be integrally formed with the first conductive layer 121. The first capacitor electrode which is the first conductive layer 121 may be electrically connected to the first semiconductor layer SL1 and the second conductive layer 122 through the first contact hole CH1. The first capacitor electrode is integrally formed with the first source electrode SE1 and the third source electrode SE3 to serve as the first source electrode SE1 and the third source electrode SE3.

The buffer layer 111 is disposed on the first capacitor electrode and the second capacitor electrode is disposed on the buffer layer 111 so as to overlap the first conductive layer 121 which is the first capacitor electrode and the second conductive layer 122 which is the third capacitor electrode. The second capacitor electrode may be integrally formed with the second semiconductor layer SL2. That is, the second capacitor electrode may be integrally formed by making a part of the second semiconductor layer SL2 conductive. Therefore, a part of the second semiconductor layer SL2 which does not become conductive serves as the second active layer ACT2 and a portion which becomes conductive serves as the second source electrode SE2 and the second capacitor electrode to overlap the first conductive layer SL1 and the second conductive layer 122. The first gate electrode GE1 is electrically connected to the second capacitor electrode through the contact hole formed in the gate insulating layer 112. Accordingly, the second capacitor electrode is integrally formed with the second source electrode SE2 to be electrically connected to the second source electrode SE2 and the first gate electrode GE1.

The gate insulating layer 112 is disposed on the second capacitor electrode and the third capacitor electrode is disposed on the gate insulating layer 112. The third capacitor electrode may be disposed so as to overlap the first capacitor electrode and the second capacitor electrode. The third capacitor electrode is integrally formed with the second conductive layer 122 and is electrically connected to the first source electrode SE1 and the third source electrode SE3 through the first contact hole CH1.

In summary, the first capacitor electrode of the storage capacitor SC is integrally formed with the first conductive layer 121 and may be electrically connected to the first semiconductor layer SL1 and the second conductive layer 122 through the first contact hole CH1. The second capacitor electrode is integrally formed with the second semiconductor layer SL2 to be electrically connected to the second source electrode SE2 and the first gate electrode GE1. The third capacitor electrode is integrally formed with the second conductive layer 122 and may be electrically connected to the first semiconductor layer SL1 and the first conductive layer 122 through the first contact hole CH1. Accordingly, the first capacitor electrode and the second capacitor electrode which overlap the buffer layer 111 therebetween configure one capacitor and the second capacitor electrode and the third capacitor electrode which overlap the gate insulating layer 112 therebetween configure another capacitor. Two capacitors described above are connected to configure a storage capacitor SC. The storage capacitor SC maintains a voltage of the first gate electrode GE1 and the first source electrode SE1 of the first transistor TR1 while the light emitting diode OLED emits light to maintain the light emitting diode OLED in the constant state.

The passivation layer 113 is disposed on the first transistor TR1, the second transistor TR2, the third transistor TR3, and the storage capacitor SC. The passivation layer 113 is an insulating layer for protecting components below the passivation layer 113. For example, the passivation layer 113 may be configured by a single layer or a double layer of silicon oxide SiOx or silicon nitride SiNx, but is not limited thereto. Further, the passivation layer 113 may be omitted depending on the exemplary aspect.

A plurality of color filters may be disposed in the emission area of each of the plurality of sub pixels SP on the passivation layer 113. As described above, the display device 100 according to the exemplary aspect of the present disclosure is a bottom emission type in which light emitted from the light emitting diode OLED is directed to the lower portion of the light emitting diode OLED and the substrate 110. Therefore, the plurality of color filters may be disposed below the light emitting diode OLED. Light emitted from the light emitting diode OLED passes through the plurality of color filters CF and implemented as various colors of light.

The planarization layer 114 is disposed on the passivation layer 113. The planarization layer 114 is an insulating layer which planarizes an upper portion of the substrate 110 on which the first transistor TR1, the second transistor TR2, the third transistor TR3, and the storage capacitor SC are disposed. The planarization layer 114 may be formed of an organic material, and for example, may be configured by a single layer or a double layer of polyimide or photo acryl, but is not limited thereto.

The light emitting diode OLED is disposed in each of the plurality of sub pixels SP. The light emitting diode OLED is disposed on the planarization layer 114 in each of the plurality of sub pixels SP. The light emitting diode OLED includes an anode AN, an emission layer EL, and a cathode CA.

The anode AN is disposed on the planarization layer 114 in the emission area EA. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto.

In the emission area EA and the circuit area CA, the emission layer 163 is disposed on the anode AN. The emission layer EL may be formed as one layer over the plurality of sub pixels SP. That is, the emission layers EL of the plurality of sub pixels SP are connected to each other to be integrally formed. The emission layer EL may be configured by one emission layer or may have a structure in which a plurality of emission layers which emits different color light is laminated. The emission layer EL may further include an organic layer such as a hole injection layer, a hole transport layer, an electron transport layer, and an electron injection layer.

In the emission area EA and the circuit area CA, the cathode CA is disposed on the emission layer EL. The cathode CA supplies electrons to the emission layer EL so that the cathode may be formed of a conductive material having a low work function. The cathode CA may be formed as one layer over the plurality of sub pixels SP. That is, the cathodes CA of the plurality of sub pixels SP are connected to be integrally formed. In the meantime, the cathode CA of the light emitting diode OLED is electrically connected to the low potential power line VSS to be supplied with a low potential power voltage.

The bank 115 is disposed between the anode AN and the emission layer EL. The bank 115 is disposed to overlap the active area AA and cover the edge of the anode AN. The bank 115 is disposed at the boundary between the sub pixels SP which are adjacent to each other to reduce the mixture of light emitted from the light emitting diode OLED of each of the plurality of sub pixels SP. The bank 115 may be formed of an insulating material such as polyimide, acryl, or benzocyclobutene (BCB) resin, but it is not limited thereto.

Referring to FIGS. 4 to 6, the second conductive layer 122 is in contact with the first conductive layer 121 and the first semiconductor layer SL1 through the first contact hole CH1 disposed on the buffer layer 111 and the gate insulating layer 112. That is, the first contact hole CH1 exposes an upper surface of the first conductive layer 121 and an upper surface and a side surface of the first semiconductor layer SL1. The second conductive layer 122 is in contact with the upper surface of the first conductive layer 121 and the upper surface and the side surface of the first semiconductor layer SL2 so that the second conductive layer 122 is in contact with the first conductive layer 121 and the first semiconductor layer SL1. At this time, an area of the first semiconductor layer SL1 exposed by the first contact hole CH may be a conductive area.

A portion in which the first conductive layer 121, the first semiconductor layer SL1, and the second conductive layer 122 are in contact with each other may serve as the first source electrode SE1 of the first transistor TR1 and the third source electrode SE3 of the third transistor TR3. That is, a portion in which the first contact hole CH1 is located is an area in which the first semiconductor layer SL1 becomes conductive and a portion in which the first source electrode SE1 and the third source electrode SE3 are connected. Therefore, a portion of the first contact hole CH1 in which the first conductive layer 121, the first semiconductor layer SL1, and the second conductive layer 122 are in contact with each other corresponds to the second node in the circuit illustrated in FIG. 3 and serves as the first source electrode SE1 of the first transistor TR1 and the third source electrode SE3 of the third transistor TR3.

In the display device having a pixel circuit as illustrated in FIG. 3, the source electrode of the driving transistor and the source electrode of the sensing transistor are one node. That is, the source electrode of the driving transistor and the source electrode of the sensing transistor need to be electrically connected to each other. However, in the display device of the related art, a metal layer which performs a different function is disposed in a space between the source electrode of the driving transistor and the source electrode of the sensing transistor. Therefore, the source electrode of the driving transistor and the source electrode of the sensing transistor are not directly connected, but are electrically connected by means of another conductive component disposed in the middle, through two contact holes. As described above, when the number of contact holes is increased, a manufacturing process margin for forming the contact hole needs to be considered so that a width of the circuit area is increased. That is, a size of the circuit area is increased so as to suppress a short phenomenon that adjacent conductive components which perform different functions are connected to each other in a process of forming the contact hole. As described above, when the size of the circuit area is increased, the size of the emission area is reduced so that the luminance is reduced. In the meantime, in order to suppress the increase of the size of the circuit area, it is considered to reduce the size of the storage capacitor. However, if the size of the storage capacitor is reduced, a capacitance of the storage capacitor is reduced so that there may be a problem in the performance of the display device.

Therefore, in the display device 100 according to the exemplary aspect of the present disclosure, the first active layer ACT1 of the first transistor TR1 and the third active layer ACT3 of the third transistor TR3 may be connected to each other. Specifically, the first semiconductor layer SL1 may configure the first active layer ACT1 and the third active layer ACT3 so that the first active layer ACT1 and the third active layer ACT3 may be configured as a single layer. Therefore, the first active layer ACT1 and the third active layer ACT3 are areas of the first semiconductor layer SL1 which does not become conductive. Therefore, the first active layer ACT1 and the third active layer ACT3 may be connected by the conductive area of the first semiconductor layer SL1 disposed between the first active layer ACT1 and the third active layer ACT3. Further, in the display device 100 according to the exemplary aspect of the present disclosure, the second conductive layer 122 is in contact with the first conductive layer 121 and the first semiconductor layer SL1 through one first contact hole CH1 disposed on the buffer layer 111 and the gate insulating layer 112. That is, together with the first active layer ACT1 of the first transistor TR1 and the third active layer ACT3 of the third transistor TR3, the first conductive layer 121 and the second conductive layer 122 serving as the capacitor electrode of the storage capacitor SC may be electrically connected to each other through one first contact hole CH1. Accordingly, in the display device 100 according to the exemplary aspect of the present disclosure, the first active layer ACT1 of the first transistor TR1, the third active layer ACT3 of the third transistor TR3, the first conductive layer 121, and the second conductive layer 122 are electrically connected through one first contact hole CH1. Therefore, an area occupied by the contact hole may be reduced. Therefore, the area of the circuit area CA is reduced without reducing the area of the storage capacitor SC and thus the area of the emission area EA is increased so that the luminance of the display device may be improved. Further, when the area of the emission area EA is maintained without increasing, the area of the storage capacitor SC may be increased as much as the area occupied by the contact hole is reduced. Accordingly, the capacitance of the storage capacitor SC is increased so that the residual image problem is solved and the display device 100 having a high luminance and a high resolution may be provided.

The exemplary aspects of the present disclosure can also be described as follows:

According to an aspect of the present disclosure, there is provided a display device. The display device includes a substrate, a first conductive layer on the substrate, a buffer layer on the first conductive layer, a first semiconductor layer on the buffer layer, a gate insulating layer on the first semiconductor layer and the buffer layer and a second conductive layer on the gate insulating layer, wherein the second conductive layer is in contact with the first conductive layer and the first semiconductor layer through a first contact hole on the buffer layer and the gate insulating layer.

The first contact hole may expose an upper surface of the first conductive layer and an upper surface and a side surface of the first semiconductor layer and the second conductive layer may be in contact with the upper surface of the first conductive layer and the upper surface and the side surface of the first semiconductor layer.

The first semiconductor layer may be formed of an oxide semiconductor and an area of the first semiconductor layer exposed by the first contact hole may be a conductive area.

The display device may further include a driving transistor, a switching transistor, a sensing transistor, and a storage capacitor disposed on the substrate and a light emitting diode which is electrically connected to the driving transistor, wherein a portion in contact with the first conductive layer, the first semiconductor layer, and the second conductive layer function as a source electrode of the driving transistor and a source electrode of the sensing transistor.

The display device may further include a second semiconductor layer which may be located on the same layer as the first semiconductor layer, may be spaced apart from the first semiconductor layer, and overlaps the first conductive layer and the second conductive layer.

The storage capacitor may include the first conductive layer, the second conductive layer, and the second semiconductor layer as capacitor electrodes.

The second semiconductor layer may be formed of the oxide semiconductor and an area of the second semiconductor layer overlapping the first conductive layer and the second conductive layer may be a conductive area.

The second semiconductor layer may configure an active layer of the switching transistor.

An active layer of the driving transistor and an active layer of the sensing transistor may be connected to each other.

The first semiconductor layer may configure the active layer of the driving transistor and the active layer of the sensing transistor.

The active layer of the driving transistor and the active layer of the sensing transistor may be configured by a single layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a substrate;
    a first conductive layer disposed on the substrate;
    a buffer layer disposed on the first conductive layer;
    a first semiconductor layer disposed on the buffer layer;
    a gate insulating layer disposed on the first semiconductor layer and the buffer layer;
    a second conductive layer disposed on the gate insulating layer;
    a driving transistor, a switching transistor, a sensing transistor, and a storage capacitor disposed on the substrate; and
    a light emitting diode electrically connected to the driving transistor,
    wherein an active layer of the driving transistor and an active layer of the sensing transistor are connected with each other,
    wherein the second conductive layer is in contact with the first conductive layer and the first semiconductor layer through a first contact hole in the buffer layer and the gate insulating layer.

2. The display device according to claim 1, wherein the first contact hole exposes an upper surface of the first conductive layer and an upper surface and a side surface of the first semiconductor layer, and
    wherein the second conductive layer is in contact with the upper surface of the first conductive layer and the upper surface and the side surface of the first semiconductor layer.

3. The display device according to claim 1, wherein the first semiconductor layer is formed of oxide semiconductor and an area of the first semiconductor layer exposed by the first contact hole is a conductive area.

4. The display device according to claim 1,
    wherein a portion in contact with the first conductive layer, the first semiconductor layer, and the second conductive layer functions as a source electrode of the driving transistor and a source electrode of the sensing transistor.

5. The display device according to claim 4, further comprising a second semiconductor layer located on a same layer as the first semiconductor layer, spaced apart from the first semiconductor layer, and overlaps with the first conductive layer and the second conductive layer.

6. The display device according to claim 5, wherein the storage capacitor includes the first conductive layer, the second conductive layer, and the second semiconductor layer as capacitor electrodes.

7. The display device according to claim 6, wherein the storage capacitor includes a first capacitor electrode, a second capacitor electrode, and a third capacitor electrode.

8. The display device according to claim 7, wherein the first capacitor electrode of the storage capacitor is integrally formed with the first conductive layer and is electrically connected to the first semiconductor layer and the second conductive layer through the first contact hole,
    the second capacitor electrode is integrally formed with the second semiconductor layer to be electrically connected to a second source electrode of the switching transistor and a first gate electrode of the driving transistor, and
    the third capacitor electrode is integrally formed with the second conductive layer and is electrically connected to the first semiconductor layer and the first conductive layer through the first contact hole.

9. The display device according to claim 4, wherein an active layer of the driving transistor and an active layer of the sensing transistor are configured by a single layer.

10. The display device according to claim 6, wherein the second semiconductor layer is formed of oxide semiconductor and an area of the second semiconductor layer overlapping with the first conductive layer and the second conductive layer is a conductive area.

11. The display device according to claim 5, wherein the second semiconductor layer is an active layer of the switching transistor.

12. The display device according to claim 1, wherein the first conductive layer overlaps with the active layer of the driving transistor.

13. The display device according to claim 1, wherein the first semiconductor layer is an active layer of the driving transistor and the active layer of the sensing transistor.

* * * * *